United States Patent [19]

Shimabukuro et al.

[11] Patent Number: 5,253,196
[45] Date of Patent: Oct. 12, 1993

[54] MOS ANALOG MEMORY WITH INJECTION CAPACITORS

[75] Inventors: Randy L. Shimabukuro, San Diego; Michael E. Stewart, La Jolla; Patrick A. Shoemaker, Lemon Grove; Graham A. Garcia, San Diego, all of Calif.

[73] Assignee: The United States of America as represented by the Secretary of the Navy, Washington, D.C.

[21] Appl. No.: 639,500

[22] Filed: Jan. 9, 1991

[51] Int. Cl.$^5$ .............. G11C 27/00; G11C 11/40; G11C 11/56
[52] U.S. Cl. .............. 365/45; 365/149; 365/185; 257/320
[58] Field of Search .......... 365/185, 145, 149, 45; 257/320

[56] References Cited

U.S. PATENT DOCUMENTS

| H1,035 | 3/1992 | Haviland et al. | 365/45 |
| 4,054,864 | 10/1977 | Audaire et al. | 365/45 |
| 4,616,245 | 10/1986 | Topich et al. | 257/320 |
| 4,665,417 | 5/1987 | Lam | 257/320 |
| 5,027,171 | 6/1991 | Reedy et al. | 365/182 |

FOREIGN PATENT DOCUMENTS 57-91561  6/1982  Japan ................. 257/320

OTHER PUBLICATIONS

"Floating Gate Device with Dual Control Gates", Larsen et al; Jan. 1979; vol. 21, No. 8, p. 3368, IBM T.D.B.

Primary Examiner—Eugene R. LaRoche
Assistant Examiner—Michael C. Kessell
Attorney, Agent, or Firm—Harvey Fendelman; Thomas Glenn Keough

[57] ABSTRACT

An integrated circuit memory element is capable of storing analog information. The memory value can be increased and decreased incrementally with no knowledge of the current state and may be stored for a long period of time. Analog memory information is stored as an electrical charge on a floating gate structure and modification of this information is accomplished by the use of hot-carrier injection to transport electrons off of as well as onto the floating gate (to erase as well as to program electrically). Charge is written onto and off of the gate by injection capacitors in deep depletion and is accomplished by having the floating gate contiguous with a piece of crystalline p-type silicon, in which a deep-depletion region may be formed so that hot electrons may be ejected from (ejected off of) the floating gate structure through the surrounding insulating oxide, and having the floating gate structure capacitively coupled to a second piece of crystalline silicon from which electrons may be injected onto the floating gate structure. The novelty of the invention resides in the utilization of avalanche injection of electrons onto and off of the floating gate using injection capacitors. This requires far less current and is more symmetric than the original dual polarity MOS analog memory devices of the prior art.

20 Claims, 5 Drawing Sheets

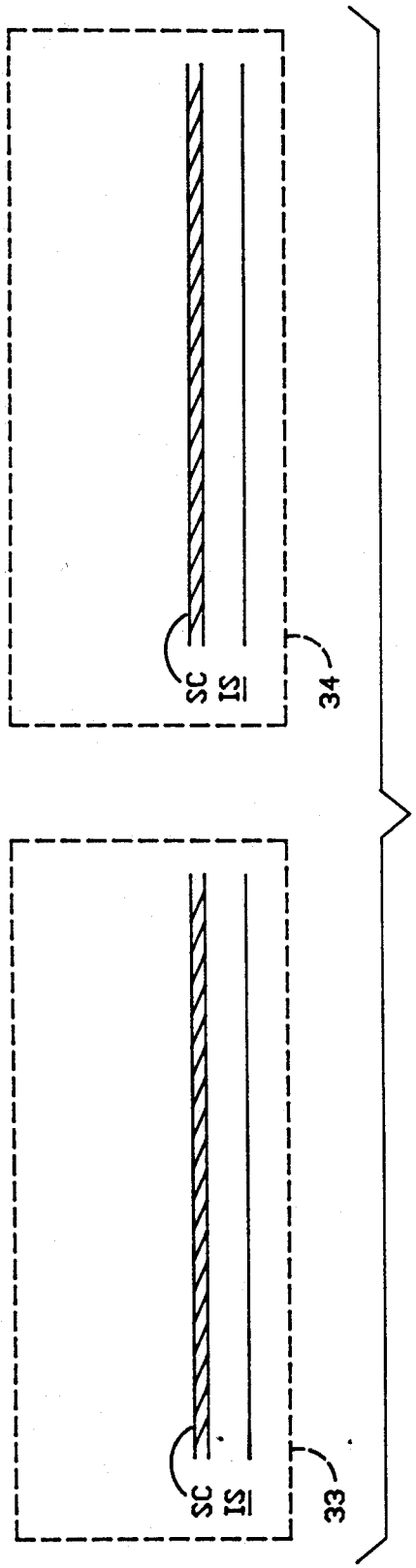
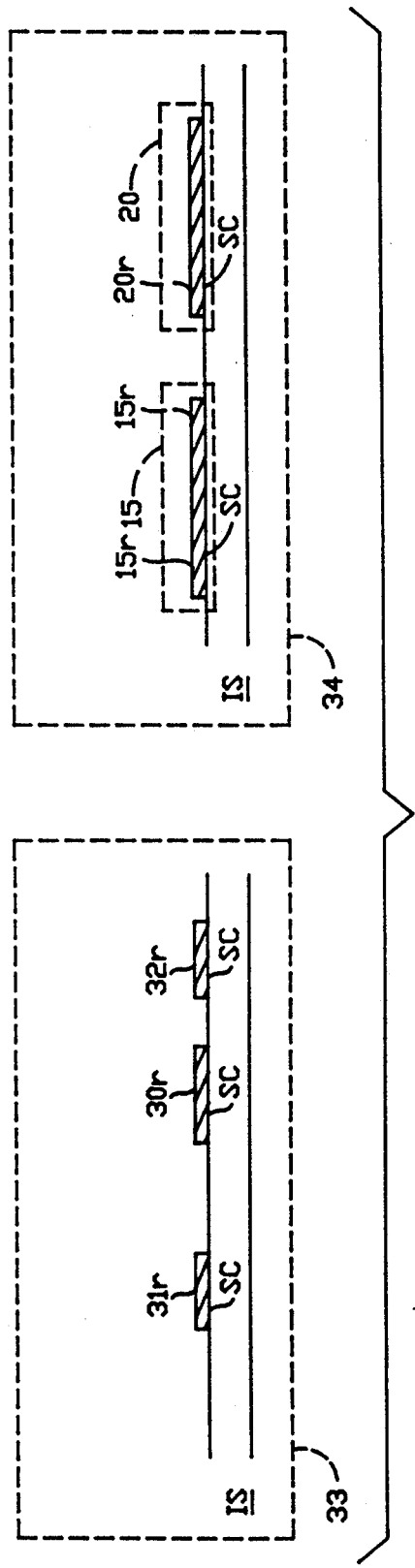
FIG. 5A
FIG. 5B

MOS ANALOG MEMORY WITH INJECTION CAPACITORS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This application is related to a co-pending patent application in the U.S. Patent and Trademark Office Ser. No. 07/405,498 filed August 28, 1989 entitled "Dual Polarity Floating Gate MOS Analog Memory Device' by Ronald E. Reedy, Randy L. Shimabukuro and Graham A. Garcia.

BACKGROUND OF THE INVENTION

An analog memory element is an essential component in a number of novel computer architectures. Associative memories, neural networks and general purpose analog computers require a means for storing analog information for long periods of time. A related MOS analog memory (MAM) was disclosed in the above referenced related patent application by Reedy, Shimabukuro and Garcia and was published as "Dual Polarity Nonvolatile MOS Analogue Memory (MAM) Cell For Neural-Type Circuitry" in *ELECTRONIC LETTERS*, Sept. 15, 1988 Vol. 24, No. 19 pp. 1231–1232. The MAM used a pair of complementary MOSFETs to inject either holes or electrons onto the floating gate. One side effect of this approach was that large currents were noted as being required to generate the avalanche injection. A further observation was that the writing of holes also was much slower than electrons by several orders of magnitude, a consequence of which is the possibility of asymmetric writing. These observations were attributed to the structure of the original MAM and the mechanism used to write charge on and off the floating gate.

Thus, a continuing need exists in the state of the art for an integrated circuit memory element that can be increased and decreased incrementally with no knowledge of the current state (i.e., which is dual-writing-polarity), in which writing rates are similar for incrementing and decrementing, and which does not require large currents for writing.

SUMMARY OF THE INVENTION

The present invention is directed to providing an improved dual-writing-polarity non-volatile MOS analog memory cell, that has a floating gate structure on which charge is stored to represent an analog value and includes injection capacitors which are used to inject charge onto and off of the floating gate structure by hot-carrier injection. This improvement allows both increment and decrement of analog non-volatile data. A pulsed source of positive analog information and a pulsed source of negative analog information are provided. Capacitively coupling the pulsed source of positive analog information or the pulsed source of negative analog information to the floating gate structure effects the low-current increment or decrement, respectively, of the stored analog value, by the use of hot-carrier injection off of and onto said floating gate structure. The electrical isolation of the floating gate structure effects the long-term storage of the analog value thereon.

An object of the invention is to provide an improved integrated circuit memory element having a variable analog memory storage capability.

Another object is to provide an integrated circuit memory element having the capability for storing data for prolonged periods of time.

Still another object of the invention is to provide an integrated circuit memory element having the capability for both increment and decrement of stored analog values by electrical means.

Still another object of the invention is to provide an integrated circuit memory element utilizing avalanche injection of electrons onto and off of a floating gate using injection capacitors.

Another object is to provide an integrated circuit memory element requiring less current and being more symmetric in writing and erasing characteristics than contemporary MOS analog memory devices.

These and other objects of the invention will become more readily apparent from the ensuing description and claims when taken in conjunction with the appended drawings.

BRIEF DESCRIPTION OF THE DRAWINGS

FIGS. 5A through 5F show a fabrication procedure in accordance with this inventive concept.

DESCRIPTION OF THE PREFERRED EMBODIMENT

Figure 1:
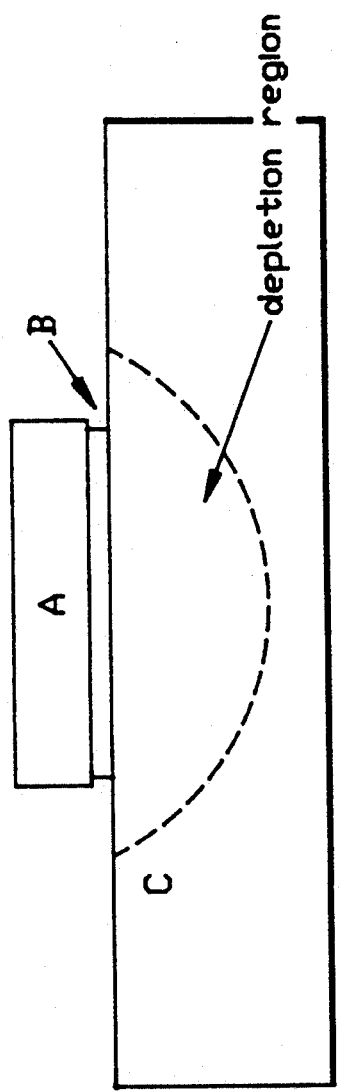
FIG. 1 shows a semiconductor capacitor.

An improvement for the above referenced MOS analog memory is to the method and manner by which the memory value is increased or decreased in the floating gates of the cells. Stacked gate structures have been proposed and built which rely upon the injection of electrons from a substrate to the gate by the normal avalanche injection of FAMOS, and taken off by deep depletion of the floating p-type polysilicon gate ($E^2$-FAMOS). Such a type of non-volatile charge storing device is described in "FAMOS-A New Semiconductor Charge Storage Device," by Frohman-Bentchkowsky, D., *SOLID STATE ELECTRONICS*, Vol. 17, pp. 517–529, 1974. The structure of the device disclosed by this reference is a p-channel, silicon gate, field effect transistor in which no electric contact is made to the silicon gate. It combines the floating gate concept with avalanche injection of electrons from the surface depletion region of a p-n junction to yield reproducible charging characteristics with long-term storage retention. FAMOS was intended to store digital weights and had to be erased by illumination with ultraviolet light. The $E^2$FAMOS device of the article by Giora Yaron et al. "$E^2$FAMOS-An Electrically Eraseable Reprogrammable Charge Storage Device", *IEEE TRANSACTIONS ON ELECTRON DEVICES*, vol. 19, differs from the device of this invention in several ways. Electrons are written onto the floating gate in the same manner as in the FAMOS, by avalanche injection from the pinchoff region of an n-channel transistor. Electrons are erased by driving the p-type floating polysilicon gate into deep depletion. However, as mentioned on p. 1756 in the Giora Yaron et al. article, polysilicon has a high concentration of electron traps which decrease the injection current from the polysilicon. Giora Yaron et al. provide that the electrons are taken off the gate by a similar method to the approach of this invention with the exception that this invention has the deep depletion region created in a single crystal silicon region rather than a polysilicon region. The device in the article by M. Garrigues et al. entitled "A High Performance Silicon-On-Sapphire Electrically Eraseable PROM", Laboratoire d'Electrinique et Mesures Electriques E. R. A. CNRS no. 661 "Genie Electronique" ECOLE CENTRALE DE LYON—BP 163-69130 ECULLY-FRANCE, 1981 IEEE is similar to this invention in the erase mode, since the deep depletion region is created in a portion of the gate which is single crystal p-type silicon. The circuit of M. Garrigues et al. also is fabricated on a silicon on insulator structure much like this invention; however, electrons are written onto the gate by the same method mentioned above. For the E$^2$FAMOS this leads to asymmetries in writing and erasing. Both the Giora Yaron et al. and the M. Garrigues et al. devices were intended to be used in a digital mode, with the gate charged neutral or negative depending upon its state.

Another device that provides non-volatile storage of data is described in "DIFMOS-A Floating Gate Electrically Erasable Non-Volatile Semiconductor Memory Technology," by Gosney, W. M., *IEEE TRANSACTIONS ON ELECTRON DEVICES*, Vol. ED-24, No. 5 May 1977. DIFMOS was intended to be used as a digital device that provides an electrically alterable read-only memory. The charge on the gate was limited only to non-positive values. DIFMOS also required a bootstrap capacitor with a 40-volt bias to erase charge on the gate. A floating gate non-volatile memory device for storing analog information is described in "A Electrically Trainable Artificial Neural Network (ETANN) with 10240 Floating Gate Synapses," Holler, M., Tam, S., Castro, H., Benson, R., *IJCNN International Joint Conference on Neural Networks*, Vol. II, Washington, DC, pp.II-191 II-196, 1989, published by the Institute of Electrical and Electronics Engineers, Inc., IEEE Cat. No. 89CH2965-6. This reference discloses a synapse cell circuit which is an NMOS version of a Gilbert-Multiplier. A pair of EEPROM cells is incorporated in which a differential voltage representing the weight may be stored or adjusted. Electrons are added to or removed from the floating gates of the EEPROM cells by Fowler-Nordheim tunneling. A desired differential floating gate voltage can be attained by monitoring the conductances of the respective EEPROM MOSFETs. This device uses a thin gate oxide which is difficult to fabricate, and which can result in low production yields. The performance of this device is sensitive to thickness variations of the gate oxide which causes variation in writing characteristics between devices. Since the EEPROM uses a differential pair of devices to achieve positive and negative weights, the updating must be done by symmetrically adjusting both devices in the pair.

All the above mentioned devices are limited to storing only zero or negative charge on the floating gate. All the devices except those in the ETANN are digital devices that are not intended to store analog information.

The above identified related patent application utilized a different mechanism to write charge on and off of the floating gate and required large currents to generate the avalanche injection. The writing of holes is several orders of magnitude slower than electron writing and can lead to asymmetric writing. The circuit described in the above identified related patent application uses a pair of enhancement mode MOSFETs to write electrons and holes onto the floating gates of another pair of MOSFETs so that either of the gates can be charged to a net positive charge by holes, or a net negative charge by the electrons.

The function and fabrication of this inventive concept can best be appreciated by first looking to FIG. 1 which depicts a semiconductor capacitor. Layer A, the gate, is a conductor consisting of metal or polysilicon. Layer B is an insulator such as silicon dioxide. Layer C is a semiconductor such as silicon, which has been doped p-type. With this structure, if a positive voltage is slowly applied to gate A relative to semiconductor C, charge carriers (holes) will be depleted out of semiconductor C. As the applied voltage is increased, semiconductor C will deplete out deeper and deeper until some maximum voltage (dependent on oxide thickness, substrate doping and the band-gap of the semiconductor) when the surface inverts. The onset of inversion limits the potential drop possible across the depletion region to the band-gap of the semiconductor. In the case of silicon, this is 1.1 volts.

If the applied positive voltage is applied as a sudden pulse, it is possible to deplete the semiconductor out much deeper than in the DC case, thereby resulting in a larger potential drop across the depletion region. This is a condition known as "deep depletion". In order for deep depletion to take place, the lifetime of carries in the semiconductor must be much larger than the time required to pulse the gate voltage. While the semiconductor is in deep depletion, it is possible for electrons generated in the depletion region to gain enough energy to get into the conduction band of the insulator and conduct across it to the gate. For a silicon dioxide barrier, the electrons must have in excess of three volts.

This invention uses this charge injection process described with respect to the semiconductor capacitor of FIG. 1 to write electrons onto and off of the floating gate in an analog memory device. In the context of this inventive concept it is referred to as hot-carrier injection off of and onto a floating gate structure.

Figure 2:
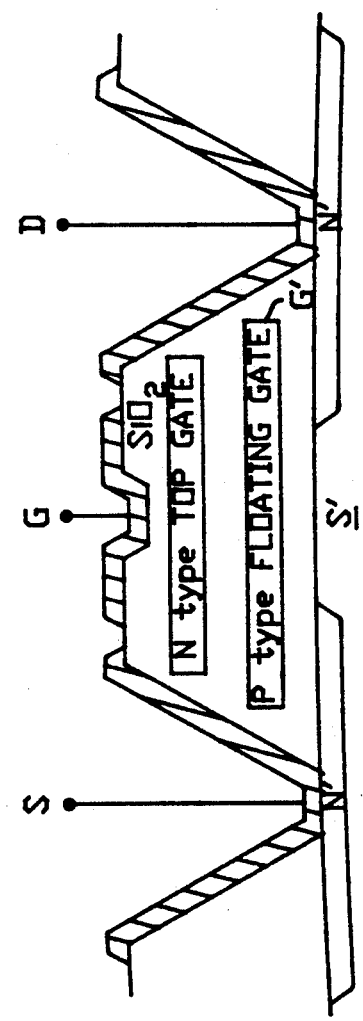
FIG. 2 shows a stacked gate structure.

A floating gate, stacked gate structure is well known and inherent in the E$^2$FAMOS configuration referred to above and is schematically depicted in FIG. 2. This calls for the injection of electrons from the substrate S' to the gate G' by the normal avalanche injection of FAMOS and the taking off of electrons by deep depletion of the floating p-type polysilicon gate. However, it has been found to be difficult to generate deep depletion in polysilicon because it has many traps and, thus, has a short lifetime. To get around this problem the polysilicon is sometimes textured to enhance the electric field.

In the current invention, as noted, one capacitor is used to inject hot carriers onto the floating gate and a second capacitor is used to inject hot carriers off of the floating gate structure. The floating gate structure may also extend to additional circuitry used to sense or read the charge resident upon it. This inventive concept is most clearly understood by reference to FIG. 3. Floating gate structure 50 forms one plate each of bias capacitor 30, injection capacitor 31, and injection capacitor 32. Bias capacitor 30 is used to bias the floating gate so that a writing voltage may be imposed across injection capacitors 31 and 32. Hot carriers may be injected off of the floating gate structure through the dielectric of capacitor 31, and hot carriers may be injected onto the floating gate structure through the dielectric of capacitor 32. The three capacitors 30, 31, and 32 will be referred to collectively as dual-writing-polarity charge injection capacitor means 33. These elements may be regarded as allowing positive or negative changes in stored analog information, when representative positive or negative pulsed sources of information are appropriately coupled thereto from a voltage source VS.

Figure 3:
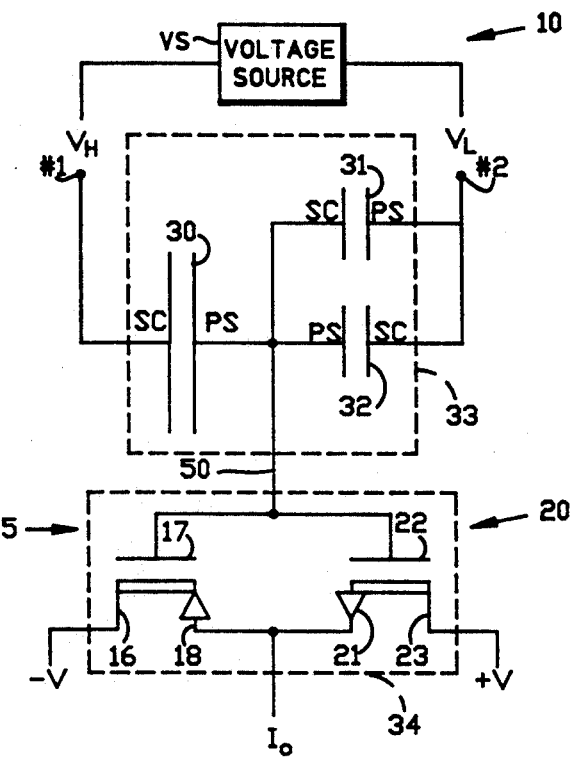
FIG. 3 shows a schematic of the new circuit having a floating gate that is partially poly and partially single crystal silicon. The circuit is to be fabricated in a silicon-on-insulator-type technology.

In FIG. 3, the floating gate structure is shown as electrically common with the gates of a pair 34 of depletion mode transistors 15 and 20, for purpose of reading or detecting the charge on the floating gate structure. The p-channel MOSFET 15 having a drain 16, gate 22, and source 18 is operatively associated with n-channel MOSFET 20 having a drain 23, gate 22, and source 21. The depletion mode transistors make up an analog multiplier 34 which allows the readout of the analog value stored on the floating gate structure, in the same way did the equivalent structure in the above identified patent application. (It is to be understood in the context of the this invention that common floating gate structure 50 may be coupled to circuitry, other than analog multiplier 34, which serves the same purpose of sensing or detecting the charge stored on the floating gate structure, and therefore can provide a mechanism for reading the analog memory. Such circuitry is well-known to those skilled in the art.)

However, the main difference in this approach, is that the two other writing MOSFETs in the above identified patent application have been replaced by writing capacitors 31, 32 and bias capacitor 30 of a bipolar or dual-writing-polarity charge injection capacitor means 33. These elements may be regarded as allowing positive or negative changes in stored analog information, when representative positive or negative pulsed sources of information are appropriately coupled thereto.

A MOS analog memory cell 10 is made up of bias or holding capacitor 30 and injection or writing capacitors 31 and 32 of dual-writing-polarity charge injection capacitor means 33, coupled by means of a common floating gate structure 50 to an analog multiplier 20 consisting of a p-channel MOSFET 15 having a drain 16, gate 22 and source 18 operatively associated with n-channel MOSFET 20 having a drain 23, gate 22 and source 21. MOSFETs 15 and 20 are depletion mode transistors.

Dual-writing-polarity charge injection capacitor means 33 performs an analog writing function to modify the analog information stored as a charge on floating gate 50. This injection capacitor means utilizes the hot carrier injection of electrons onto and off of floating gate 50. This will require far less current and be much more symmetric than the above referenced patent application.

The stored charge on floating gate 50 is modified as follows: a second terminal #2 is provided a signal $V_1$ from voltage source VS that is pulsed positive relative (representing an incremental positive analog input signal) to a signal $V_h$ at a first terminal #1 with a voltage of sufficient magnitude, then the left side (single crystal silicon) of the upper capacitor 31 will be deep depleted and electrons will be taken off floating gate 50. If, on the other hand, $V_1$ is pulsed negative at terminal #2 (representing an incremental negative analog input signal) with respect to the signal $V_h$ at terminal #1 with a voltage of sufficient magnitude, then the right side of lower capacitor 32 will deep deplete and electrons will be injected onto floating gate 50. The floating gate is dielectrically isolated and is thus very stable when no writing voltages are applied.

The total injected charge, representative of analog increments and decrements, is thus integrated onto the floating gate structure and can be read out through the pair of MOSFETs 15 and 20.

The circuit is similarly fabricated in accordance with well known techniques such as those described in *VLSI Technology*, edited by S. M. Sze, Mcgraw-Hill Book Company, 1983. By way of example, a process for fabricating the devices of injection capacitor circuit 33 and circuit pair 34 in silicon on insulator is described below.

Figure 4:
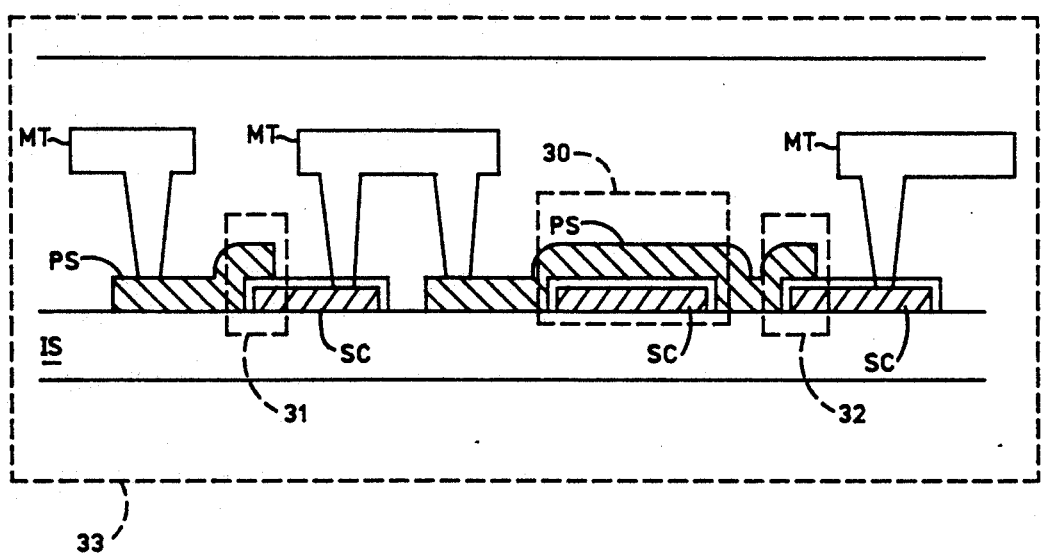
FIG. 4 shows a cross section of capacitor actuation circuit with the constituents polysilicon PS, single crystal silicon SC, insulating substrate IS, and metal portions MT.

FIG. 4 shows a cross section of capacitors 30, 31 and 32 and the constituents polysilicon PS, single crystal silicon SC and metal portions MT. The fabrication procedure begins with the providing of a starting material as shown in FIG. 5A. A layer or film of single crystal silicon SC is disposed on top of a sapphire insulating substrate IS. Regions $30_r$, $31_r$, $32_r$, $15_r$ and $20_r$ of SC which are to become active regions are masked off photolithographically and etched to form the islands shown in FIG. 5B.

Figure 5C:
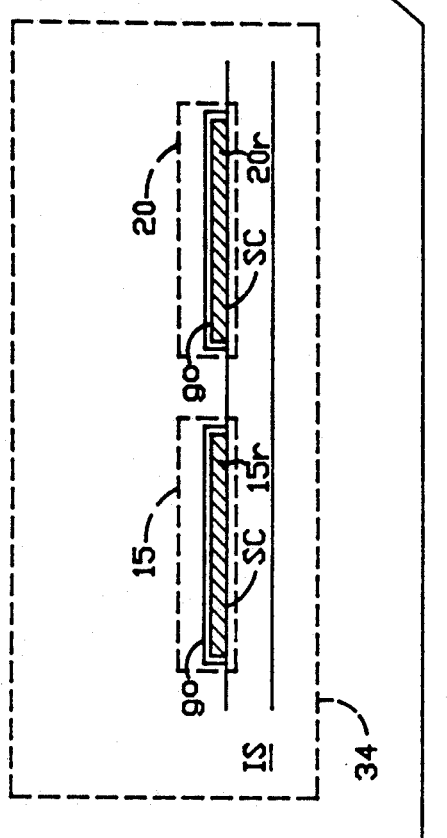

The right side of FIG. 5B shows that region $15_r$ of MOSFET 15 is selectively doped p-type by masking off the complementary regions and ion implanting Boron. Region $30_r$ of capacitor 30 and region $20_r$ of MOSFET 20 are selectively doped n-type by a similar process but using either Arsenic or Phosphorous as a dopant, (region $30_r$ of capacitor 30 may be doped either n or p type). A gate oxide "go" is thermally grown over the silicon islands or regions $30_r$, $31_r$, $32_r$, $15_r$ and $20_r$, see FIG. 5C. By way of example only and not to be limiting, the oxides on the devices of injection capacitor circuit or means 33 should be less than or equal to 25 nanometers. The oxides on the devices of transistor pair 34 may be the same thickness or thicker depending on the desired characteristics of the depletion mode transistors.

Figure 5D:
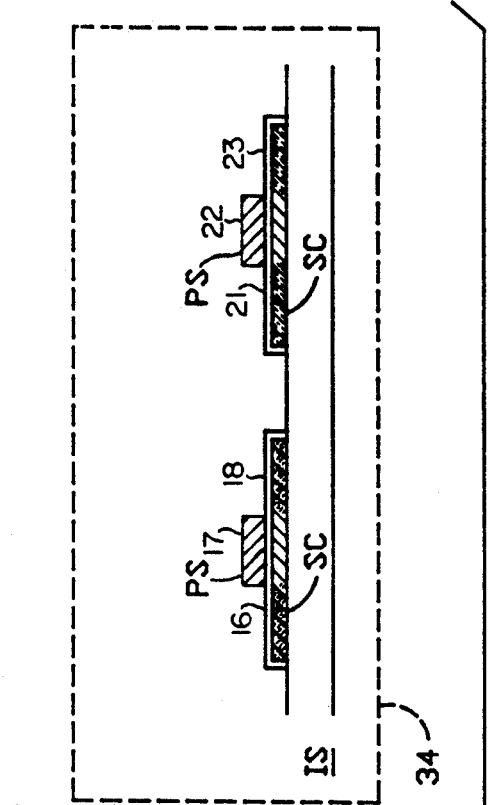

Referring now to FIG. 5D, a layer of polysilicon (PS) is deposited, doped, patterned and etched as shown with respect to the components of injection capacitor circuit 33 and transistor pair 34. The capacitances of writing capacitors 31 and 32 are determined by the small amount of overlap between the PS and SC regions. The PS is used with a standard photomasking to do a self aligned implant of p+into MOSFET 15, capacitor 31 and capacitor 32; and n+into the region of MOSFET 20. The p+regions in the SC of capacitors 31 and 32 are where the deep depletion injection occurs. This feature is essential to realize the advantages of this inventive concept. The p+and n+in circuit pair 34 form the sources and drains 16, 18, 21, and 23.

Figure 5E:
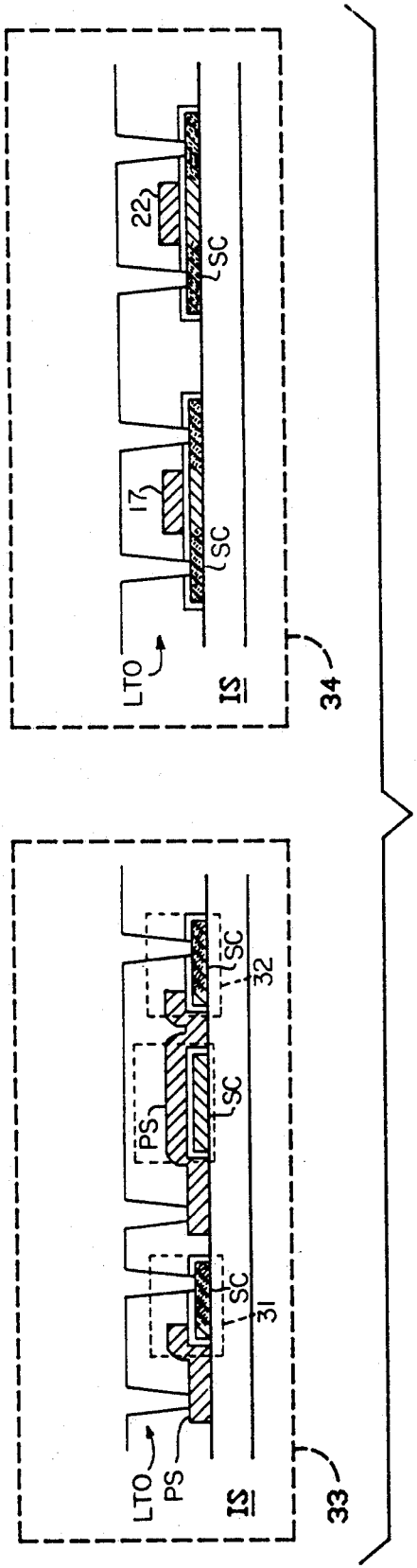

A layer of low temperature oxide (LTO) is deposited over the entire surface and contact holes are patterned and etched as shown in FIG. 5E. A layer of metal (MT) is deposited and etched, see FIG. 5F. This makes contact between devices. Not shown in this figure are the contacts to gates 17 and 22, and the SC portion of capacitor 30. These contacts are out of the plane of the figure.

Figure 5F:
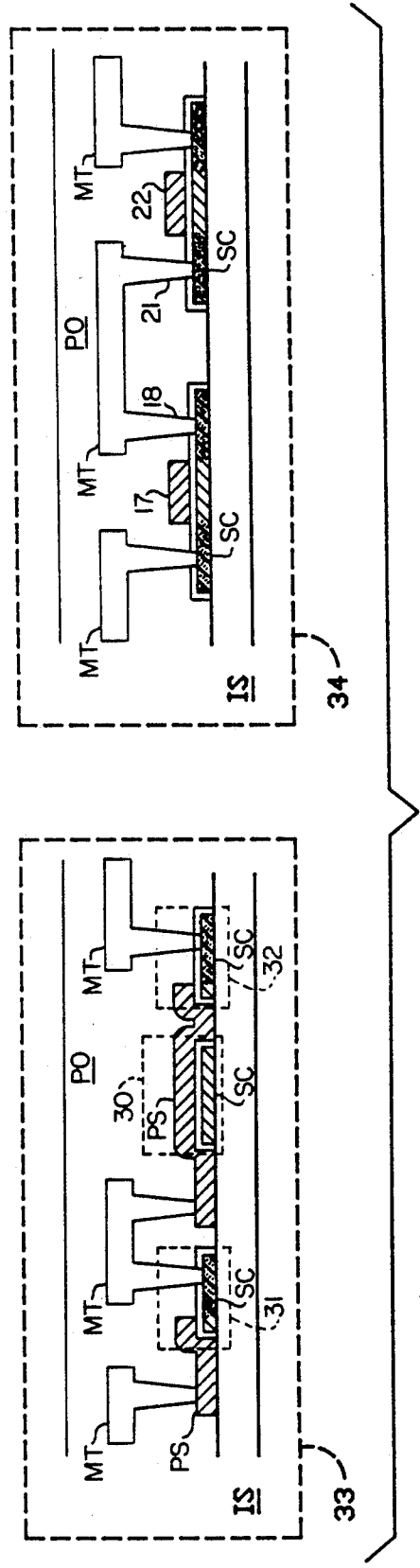

Next, a layer of passivation oxide (PO) is deposited over all the circuitry, see FIG. 5F. This passivation oxide layer and the previous layer of oxide are depicted as being merged and form the barrier to prevent charge from leaking off the floating gate. The passivation oxide is patterned and etched to allow electrical contact to be made externally. These electrical contact regions are not shown.

The injection of electrons on and off floating gate 50 is accomplished by a deep depletion in the single crystal silicon. The device requires only one level of polysilicon which makes the fabrication simpler than the stacked gate type structures mentioned previously.

Capacitor 30, a bias or holding capacitor, biases the floating gate during writing. The positive and negative values stored in analog form on floating gate 50 can be increased and decreased incrementally by merely reactuating the injection capacitor circuit 33 in the aforedescribed way using representative positive and negative pulses. The representative positive and negative pulses are derived from a variety of positive analog signal and negative analog sources from voltage source VS appropriately coupled to terminals #1 and #2. Elaboration regarding their exact make-up has been dispensed with to avoid belaboring the obvious.

This injection capacitor circuit inventive concept could find application for other floating gate structures in which part of the gate is a p-type semiconductor with a long carrier lifetime. If this gate is to be formed with polysilicon, some other process must be used to increase the carrier lifetime.

Obviously, many modifications and variations of the present invention are possible in the light of the above teachings. It is therefore to be understood that within the scope of the appended claims, the invention may be practiced otherwise than as specifically described.

We claim:

1. A dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure; and a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure.

2. A dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing, a first terminal capacitively coupled by said bias capacitor of said injection capacitor means to said floating gate structure to allow a bias of said floating gate structure;

a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure; and a source, coupled to said first terminal and said second terminal, capable of providing voltage pulses of either positive or negative polarity, said voltage pulses being of such a magnitude that when at least one of said voltage pulses is applied across said first and second terminals and causes said first terminal to be electrically positive with respect to said second terminal, electrons are injected onto said floating gate structure, and when at least one of said voltage pulses is applied across said first and second terminals and causes said first terminal to the electrically negative with respect to said second terminal, electrons are injected off of said floating gate structure.

3. A dual-writing polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure; and a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrodes may be injected onto said floating gate structure, said dual-writing-polarity non-volatile MOS analog memory cell being fabricated on an insulating substrate using a silicon-on-insulator technology and said first region and said second region each constitutes a p-type crystalline silicon island, one of which is electrically connected to said floating gate structure and which is otherwise electrically isolated on said insulating substrate, and the other of which is capacitively coupled to said floating gate structure.

4. A dual-writing-polarity non-volatile MOS analog memory cell having a floating gate structure, an improvement therefor is provided comprising:
injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors, coupled to a bias capacitor, said bias capacitor being used to bias said floating gate during writing;
a first terminal capacitively coupled by said bias capacitor of said injection capacity means to said floating gate structure to allow a bias of said floating gate structure;
a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure; and
a source, coupled to said first terminal and said second terminal, capable of providing voltage pulses of either positive or negative polarity, said voltage pulses being of such a magnitude that when at least one of said voltage pulses is applied across said first and second terminals and causes said firs terminal to be electrically positive with respect to said second terminal, electrons are injected onto said floating gate structure, and when at least one of said voltage pulses is applied across said first and second terminals and causes said first terminal to be electrically negative with respect to said second terminal, electrons are injected off of said floating gate structure, said dual-writing-polarity non-volatile MOS analog memory cell is fabricated on an insulating substrate using a silicon-on-insulator technology sand said first region and said second region each constitutes a p-type crystalline silicon island, one of which is electrically connected to said floating gate structure and which is otherwise electrically isolated on said insulating substrate, and the other of which is capacitively coupled to said floating gate structure.

5. In a dual-writing-polarity non-volatile MOS analog memory cell fabricated from a film of silicon on a sapphire insulating substrate having a floating gate structure, an improvement therefor is provided comprising:
injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and having one injection capacitor of said injection capacitor means having a first region and another injection capacitor of said injection capacitor means having a second region, said first region and said second region each constitutes a p-type crystalline silicon island, one of which is electrically connected to said floating gate structure and which his otherwise electrically isolated on said insulating substrate, and the other of which is capacitively coupled to said floating gate structure.

6. In a dual-writing-polarity non-volatile MOS analog memory cell fabricated from a film of silicon on a sapphire insulating substrate having a floating gate structure, an improvement therefor is provided comprising:
injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitor coupled to a bias capacitor, one injection capacitor of said injection capacitor means having a first region and the other injection capacitor of said injection capacitor means having a second region, said bias capacitor being used to bias said floating gate during writing and said first region and said second region each constitutes a p-type crystalline silicon island, one of which is electrically connected to said floating gate structure and which is otherwise electrically isolated on said insulating substrate, and the other of which is capacitively coupled to said floating gate structure.

7. In a dual-writing-polarity non-volatile MOS analog memory cell fabricated from a film of silicon on a sapphire insulating substrate having a floating gate structure, an improvement therefor is provided comprising:
injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;
a first terminal capacitively coupled by said bias capacitor of said injection capacitor means to said floating gate structure to allow a bias of said floating gate structure; and
a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure.

8. In a dual-writing-polarity non-volatile MOS analog memory cell fabricated from a film of silicon on a sapphire insulating substrate having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure;

a second terminal capacitively coupled by both said injection capacitors of said injection capacitor means to said floating gate structure to allow injection of charge onto and off of said floating gate structure, one of said injection capacitors of said injection capacitors means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure; and a source, coupled to said first terminal and said second terminal, capable of providing voltage unless of either positive or negative polarity, said voltages being of such a magnitude that when at least one of said voltage pulses is applied across said first and second terminals and causes said first terminal to be electrically positive with respect to said second terminal, electrons are injected onto said floating gate structure, and when at least one of said voltage pulses is applied across said first and second terminals and causes said first terminal to be electrically negative with respect to said second terminal, electrons are injected off of said floating gate structure, said first region and said second region each constitutes a p-type crystalline silicon island, one of which is electrically connected to said floating gate structure and which is otherwise electrically isolated on said insulating substrate, and the other of which his capacitively coupled to said floating gate structure.

9. In a dual-writing-polarity non-volatile MOS analog memory cell fabricated from constituent elements of polysilicon, single crystal silicon, silicon dioxide and metal portions on a sapphire insulating substrate having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and having one injection capacitor of said injection capacitor means having a first region and another injection capacitor of said injection capacitor means having a second region, said first region and said second region each constitutes a p-type crystalline silicon island, one of which is electrically connected to said floating gate structure and which is otherwise electrically isolated on said insulating substrate, and the other of which is capacitively coupled to said floating gate structure.

10. In a dual-writing-polarity non-volatile MSO analog memory cell fabricated from constituent elements of polysilicon, single crystal silicon, silicon dioxide and metal portions on a sapphire insulating substrate having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to said bias capacitor, one injection capacitor of said injection capacitor means having a first region and the other injection capacitor of said injection capacitor means having a second region, said bias capacitor being used to bias said floating gate during writing and said first region and said second region each constitutes a p-type crystalline silicon island, one of which is electrically connected to said floating gate structure on which is otherwise electrically isolated on said insulating substrate, and the other of which is capacitively coupled to said floating gate structure.

11. In a dual-writing-polarity non-volatile MOS analog memory cell fabricated from constituent elements of polysilicon, single crystal silicon, silicon dioxide and metal portions on a sapphire insulating substrate having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure; and a second terminal capacitively coupled by both of said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure.

12. In a dual-writing-polarity non-volatile MOS analog memory cell fabricated from constituent elements of polysilicon, single crystal silicon, silicon dioxide and metal portions on a sapphire insulating substrate having a floating gate structure, an improvement therefor is provided comprising;

injection capacitor means, including as part thereof said floating gate structure, for permitting the modification of analog information stored in the form of charge on said floating gate structure by the use of hot-carrier injection onto and off of said floating gate structure, said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure;

a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure; and a source, coupled to said first terminal and said second terminal, capable of providing voltage pulses of either positive or negative polarity, said voltage pulses being of such a magnitude that when at least one of said voltage pulses is applied across said first and second terminals and causes said first terminal to be electrically positive wit respect to said second terminal, electrons are injected onto said floating gate structure, and when at least one of said voltage pulses is applied across said first and second terminals and causes said first terminal to be electrically negative with respect to said second terminal, electrons are injected off of said floating gate structure.

13. In a dual-writing-polarity non-volatile MOS analog memory cell fabricated having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and having a pair of interconnected injection capacitors including one injection capacitor of said injection capacitor means having a first region and another injection capacitor of said injection capacitor means having a second region, said first region and said second region each constitutes a p-type crystalline silicon island, one of which is electrically connected to said floating gate structure and which is otherwise electrically isolated on said insulating substrate, and the other of which is capacitively coupled to said floating gate structure and a depletion-mode multiplier circuit coupled to said injection capacitors so as to detect or read the charge on said floating gate structure.

14. In a dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and said injection capacitor means includes a pair of interconnected injection capacitors coupled to a bias capacitor, one injection capacitor of said injection capacitor means having a first region and the other injection capacitor of said injection capacitor means having a second region, said bias capacitor being used to bias said floating gate during writing and said first region and said second region each constitutes a p-type crystalline silicon island, one of which is electrically connected to said floating gate structure and which is otherwise electrically isolated on said insulating substrate, and the other of which is capacitively coupled to said floating gate structure and a depletion-mode multiplier circuit coupled to said injection capacitors so as to detect or read the charge on said floating gate structure.

15. In a dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure;

a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected into said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure; and a depletion-mode multiplier circuit pulsed to said injection capacitors so as to detect or read the charge on said floating gate structure.

16. In a dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off if said floating gate structure, said dual-writing-polarity non-volatile MOS analog memory cell being fabricated on said insulating substrate having a silicon-on-insulator technology and said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure;

a second terminal capacitively coupled by both said injection capacitors of said injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which his electrically connected to said floating gate structure and which is otherwise electrically isolated on said insulating substrate, and the other of which is capacitively coupled to said floating gate structure;

a source, coupled to said first terminal and said second terminal, capable of providing voltage pulses of either positive or negative polarity, said voltage pulses being of such a magnitude that when at least one of a voltage pulses is applied across said first and second terminals and causes said first terminal to be electrically positive with respect to said second terminal, electrons are injected onto said floating gate structure, and when at lest one of said voltage pulses is applied across said first and second terminals and causes said first terminal to be electrically negative with respect to said second terminal, electrons are injected off of said floating gate structure; and a depletion-mode multiplier circuit coupled to said injection capacitors so as to detect or read the charge on said floating gate structure.

17. In a dual-writing-polarity non-volatile MOS analog memory cell fabricated having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and having a pair of interconnected injection capacitors including one injection capacitor of said injection capacitor means having a first region and another injection capacitor of said injection capacitor means having a second region, said first region and said second region each constitutes a p-type crystalline silicon island, one of which is electrically connected to said floating gate structure and which is otherwise electrically isolated on said insulating substrate, and the other of which is capacitively coupled to said floating gate structure, said injection capacitor means includes a bias capacitor fabricated from polysilicon PS, silicon dioxide and single crystal silicon SC to bias said floating gate structure during writing.

18. In a dual-writing-polarity non-volatile MOS analog memory cell having a floating gate structure, an improvement therefor is provided comprising:

injection capacitor means, icnlduign as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and said injection capacitor means includes a pair of interconnected injection capacitors coupled to a bias capacitor, one injection capacitor of said injection capacitor means having a first region and the other injection capacitor means having a first region and the other injection capacitor of said injection capacitor means having a second region, said bias capacitor being used to bias said floating gate during writing sand said first region and said second region each constituents a p-type crystalline silicon island, one of which is electrically connected to said floating gate structure and which is otherwise electrically isolated on said insulating substrate, and the other of which is capacitively coupled to said floating gate structure, said bias capacitor being fabricated from polysilicon PS, silicon dioxide and single crystal silicon SC to bias said floating gate structure during writing.

19. In a dual-writing-polarity non-volatile MOS analog memory cell having a floating gate structure, an improvement therefor is provided comprising:

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure; and a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure, said bias capacitor being fabricated from polysilicon PS, silicon dioxide and single crystal silicon SC to bias said floating gate structure during writing.

20. In a dual-writing-polarity non-volatile MOS analog memory cell having a floating gate structure, an improvement therefor is provided comprising;

injection capacitor means, including as part thereof said floating gate structure, for permitting the modification of analog information stored in the form of charge on said floating gate structure by the use of hot-carrier injection onto and off of said floating gate structure, said dual-writing-polarity non-volatile MOS analog memory cell being fabricated on said insulating substrate using a silicon-on-insulator technology and said injection capacitor means includes a pair of interconnected injection capacitors coupled to a bias capacitor, said bias capacitor being used to bias said floating gate during writing;

a first terminal capacitively coupled by said bias capacitor of said injection capacitor means to said floating gate structure to allow a bias of said floating gate structure;

a second terminal capacitively coupled by both said injection capacitors of said injection capacitor means to said floating gate structure to allow injection of charge onto and off of said floating gate structure, one of said injection capacitors of said injection capacitor means includes a first region of p-type crystalline silicon capacitively coupled to said second terminal from which first region electrons may be injected off of said floating gate structure, and the other of said injection capacitors of said injection capacitor means includes a second region of p-type crystalline silicon electrically connected to said second terminal from which second region electrons may be injected onto said floating gate structure, said first region and said second region each constitutes a p-type crystalline silicon island, one of which is electrically connected to said floating gate structure and which is otherwise electrically isolated on said insulating substrate, and the other of which is capacitively coupled to said floating gate structure; and a source, coupled to said first terminal and said second terminal, capable of providing voltage pulses of either positive or negative polarity, said voltage pulses being of such a magnitude that when at least one of said voltage pulses is applied across said first and second terminals and causes said first terminal to be electrically positive with respect to said second terminal, electrons are injected onto said floating gate structure, and when at least one of said voltage pulses is applied across said first and second terminals and causes said first terminal to be electrically negative with respect to said second terminal, electrons are injected off of said floating gate structure, said bias capacitor being fabricated from polysilicon PS, silicon dioxide and single crystal silicon SC to bias said floating gate structure during writing.

* * * * *